United States Patent [19]

Borkowicz et al.

[11] Patent Number: 4,851,956
[45] Date of Patent: Jul. 25, 1989

[54] PACKAGED SOLID-STATE SURGE PROTECTOR

[75] Inventors: Gerzy Borkowicz, Ottawa; William P. Trumble, Kanata; James E. Anderson, Ontario, all of Canada

[73] Assignee: Northern Telecom Limited, Ottawa, Canada

[21] Appl. No.: 101,094

[22] Filed: Sep. 25, 1987

[30] Foreign Application Priority Data

Jan. 26, 1987 [CA] Canada .................................... 528200

[51] Int. Cl.$^4$ .................................................. H02H 1/04
[52] U.S. Cl. ..................................... 361/118; 361/117; 357/39
[58] Field of Search ............... 361/110, 111, 117, 118, 361/119, 126, 127, 124; 357/39

[56] References Cited

U.S. PATENT DOCUMENTS

| | | | |
|---|---|---|---|
| 3,928,093 | 12/1975 | van Tongerloo et al. | 357/39 X |
| 4,646,037 | 2/1987 | Turolla et al. | 361/119 X |
| 4,658,324 | 4/1987 | Splitt | 361/119 |
| 4,701,825 | 10/1987 | Pagliuce | 361/119 |
| 4,730,229 | 3/1988 | De Luca et al. | 361/124 X |
| 4,760,439 | 7/1988 | Borkowicz | 357/39 |

FOREIGN PATENT DOCUMENTS

| | | |
|---|---|---|
| 123126 | 10/1984 | European Pat. Off. . |
| 3113850 | 1/1982 | Fed. Rep. of Germany . |
| 3238557 | 4/1984 | Fed. Rep. of Germany . |
| 2598031 | 10/1987 | France . |
| 2057762 | 4/1981 | United Kingdom . |

*Primary Examiner*—Derek S. Jennings
*Attorney, Agent, or Firm*—Foley & Lardner, Schwartz, Jeffery, Schwaab, Mack, Blumenthal & Evans

[57] ABSTRACT

A solid-state surge protection device comprises two electrodes between which is sandwiched a semiconductor chip. A resilient, annular, sealing member comprised of a thermoplastic resin extends around the periphery of the device and is adhered to both electrodes. The resin is a flexible, dielectric material which is not disrupted by heat generated under surge conditions in the device, and which is environmentally inert. The electrodes can be soldered to opposite surfaces of the chip.

26 Claims, 5 Drawing Sheets

PACKAGED SOLID-STATE SURGE PROTECTOR

BACKGROUND OF THE INVENTION

The present invention relates to a packaged, solid-state surge protector and its use in the protection of telecommunication and other electronic systems that are subject to transient current surges of up to $10^4$ amps or more.

Electronic systems often must be protected against transient current surges which might otherwise damage the system. For example, power-transmission systems and telecommunications systems typically incorporate surge protectors, for example, where conductors enter a central office or a building, whether industrial, commercial or residential, and at various other positions in the system.

Conventional protectors often include a gap across which a surge current shorts to ground, i.e., the protector provides a connection to ground in parallel with the conductor it is protecting, with the gap normally providing isolation. The form of the protector varies. The gap may thus be between two carbon blocks or electrodes, and open to the atmosphere. Alternatively, in so-called "gas tube" protectors the gap may be between two electrodes sealed within a housing, the gap being at a subatmospheric pressure.

Surge protectors that incorporate a gap have several drawbacks, including the inherently statistical nature of current conduction across the gap, which are reflected in an undesirable instability. An open-air gap, for example, is subject to contamination which affects conduction across the gap in an unpredictable manner. A gas tube protector can leak, resulting in an increase in internal pressure and breakdown voltage.

Accordingly, it has been proposed to protect electronic systems against surges by means of a unidirectional or bidirectional semiconductor (solid-state) device wherein an avalanche-breakdown phenomenon is exploited to effect a clamp on voltage, as in a zener diode, or a regenerative feedback action, as in a thyristor. A semiconductor device of this sort is typically an overvoltage protector, and is structurally similar to standard, medium-power semiconductor devices like the thyristor.

Unlike standard semiconductor devices, however, a semiconductor overvoltage protection device must fulfill a specific role, both before and after failure, in the circuit where it is a component. In particular, after the device fails (due to a current surge) it must provide a sustained short between the conductors in the circuit of which the device is a part. Also in contrast to standard semiconductor power devices, semiconductor overvoltage protectors normally do not operate in a rapid-repetitive mode, but rather are subjected to transient surges (or to trains of transient pulses which have the effect of a single surge) which vary in duration and amplitude. By virtue of practical limits on heat transfer through a protector device, heat generated by such a transient cannot be removed from the device in a period comparable to the duration of the transient.

Thus, while the average power normally dissipated by a semiconductor protection device is very low, the instantaneous power (and the heat generated) during a transient surge can reach levels sufficient to destroy totally the active (semiconductor) region of the device, which in turn can lead to loss of contact between the conductors and the elimination of the short. Because they are prone to destruction in this fashion at a relatively low current surges, semiconductor protection devices have heretofore been limited in their use to circuits where maximum surges were well below $10^4$ amps.

SUMMARY OF THE INVENTION

It is therefore an object of the present invention to provide a semiconductor protection device wherein, upon failure, a short is sustained even after very large surges, e.g., on the order of $10^4$ amps or more.

It is also an object of the present invention to provide an electronic system comprising means for protecting the system against large, transient surges that would completely destroy a conventional semiconductor protector.

In accomplishing the foregoing objects, there has been provided, in accordance with one aspect of the present invention, a semiconductor surge protection device comprising a first electrode and a second electrode; a heat- and electrical-conductive layer applied to a surface of the first and second electrodes, respectively; a semiconductor chip that contacts both of the conductive layers; and a resilient, annular sealing member extending around the periphery of and adhered to both the electrodes, wherein the sealing member (a) defines with said electrodes a cavity in which the chip is provided and (b) comprises a thermoplastic resin which is a flexible, dielectric material. In one preferred embodiment, the conductive layer is a solder layer which joins an electrode to a surface of the chip.

In accordance with another aspect of the present invention, there has been provided an electronic system comprising at least one circuit that includes surge-protecting means for protecting the circuit against a current surge up to $10^4$ amps or more, which surge-protecting means comprises a semiconductor device as described above.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will be readily understood by the following description of certain embodiments, by way of example, in conjunction with the accompanying drawings, in which.

DETAILED DESCRIPTION OF THE DRAWINGS

The present invention provides a packaged semiconductor protector comprising two metal electrodes, preferably copper, that have a semiconductor chip sandwiched between them, and an annular, synthetic-resin sealing member. In this context, "chip" denotes semiconductor element, either unidirectional or bidirectional, in the form of a zener diode or thyristor.

The sealing member extends around the periphery and partially between the two electrodes, to each of which is the member is adhered. The resin comprising the sealing member is a dielectric material that is flexible or pliable, metal-adherent, and resistant to disruption under the heat conditions of a surge through the device.

The electrodes are positioned along opposite surfaces of the chip, and are separated from the chip, respectively, by a layer that is both heat- and electrically conductive. An electrode can be soldered to a chip surface, i.e., the aforesaid conductive layer can be a solder layer. Alternatively, an electrode can be placed under mechanical tension to keep it pressed against a chip surface, with a suitably conductive metal foil or coating interposed therebetween.

It has been discovered that the rigid packaging heretofore adapted in the art from use with standard, medium-power semiconductor devices to use with semiconductor protection devices of comparable configuration is, in fact, incompatible with achieving a sustained short in circuits that experience high-amplitude surges of the sort mentioned above. For example, it has been found that the inflexibility of conventional package components and sealing materials precludes the reinstatement of a short circuit, following a surge-induced, explosive destruction surge of the active region in known semiconductor protectors, even with the application of external pressure to the electrodes; that is, failure of a conventional semiconductor protector under high-current conditions generally results in the interposition of rigid packaging fragments between the electrodes, preventing a short circuit.

The foregoing problems are overcome in a surge protector within the present invention, which can therefore be used in electronic systems that must be protected against high-current surges, of up to $10^4$ amps or more, which cannot be handled by existing semiconductor protective devices. In a protector configured in accordance with the present invention, the pliable sealing member represents the resilient portion of a cavity, defined by the electrodes and the member, in which to secure the semiconductor chip so as to ensure against package destruction and the ejection of chip fragments under the conditions of a high-amplitude surge. Also, the thermoplastic nature of the sealing member permits direct contact of the electrodes under external pressure, sustaining a short circuit in the event of total chip destruction.

Figure 1:
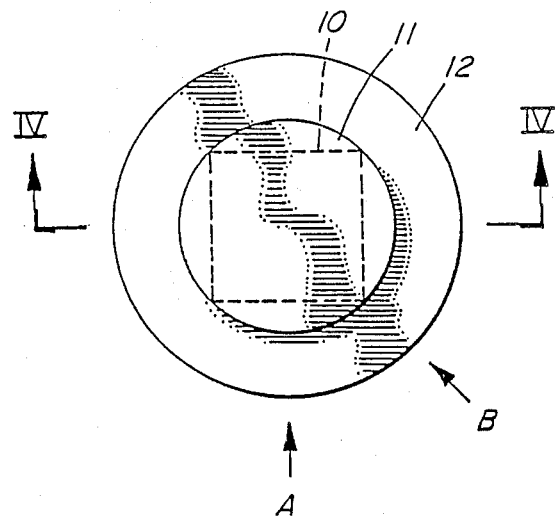
FIG. 1 is top plan view of a protector device of the present invention, prior to application of the synthetic sealing ring.
Figure 2:
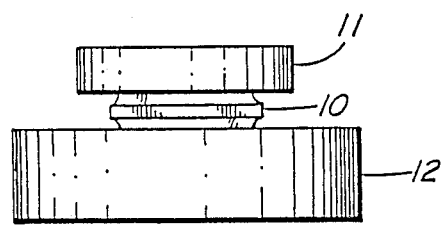
FIGS. 2 and 3 are side views in the direction of arrows A and B, respectively, on FIG. 1.
Figure 3:
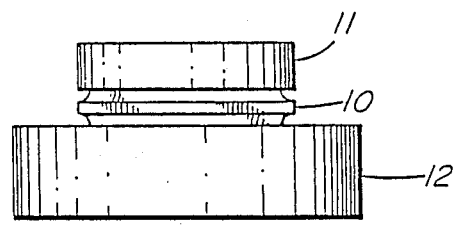

The protector device of the present invention, as illustrated in FIGS. 1, 2 and 3, comprises a semiconductor chip 10 positioned between, and in heat/electrical-conductive communication with, two electrodes 11 and 12, hereafter designated as the upper and lower electrodes, respectively. Each of the electrodes can be connected to the chip by a layer of solder, as will be described below in relation to FIGS. 4 and 5, or separated from the chip by a metal foil or coating against which the electrode is pressed. The thermal response of the protective device to repetitive transients of non-destructive amplitude can be controlled, pursuant to the present invention, by adjusting total electrode mass and thickness, as described in greater detail below. When solder is used, affecting thermal resistance and transient thermal impedance, the thickness of the solder layer also influences the thermal response of the protector.

In the arrangement illustrated in FIGS. 1-3, chip 10 is square in plan form, although it can be round or such other shape as desired. Chip 10 can be a silicon-based semiconductor chip having a structure similar to that of the device disclosed in U.S. Pat. No. 3,928,093, the contents of which are hereby incorporated by reference. The specific structure of the chip is not critical, however, so long as the function described above with regard to avalanche breakdown is fulfilled.

Electrodes 11 and 12 are preferably copper, but can comprise any suitably conductive metal or alloy (brass, aluminum, etc.). The electrodes can also be plated, for example, nickel-plated.

The shape and relative dimensions of the electrodes are selected, respectively, to provide for self-support of the assembly, thereby permitting the use of a flexible, thermoplastic resin to comprise the sealing member, as described above. The electrodes can be of the same approximate size, but one is preferably larger than the other, as the presence of a larger electrode insures against the loss of viscous resin during assembly and enables the surface tension of the liquid resin to provide a sealing force.

In FIGS. 1 to 6, electrodes 11 and 12 are shown as circular in plan form. Generally, this is the most convenient shape, particularly when protectors in accordance with the invention are to be used as retrofit devices in existing protector modules. But the electrodes can be of other shapes, such as square, hexagonal, triangular or oval in plan form. Also, it is not essential that both electrodes have the same plan form, so long as each electrode covers the entire chip surface it faces.

Figure 4:
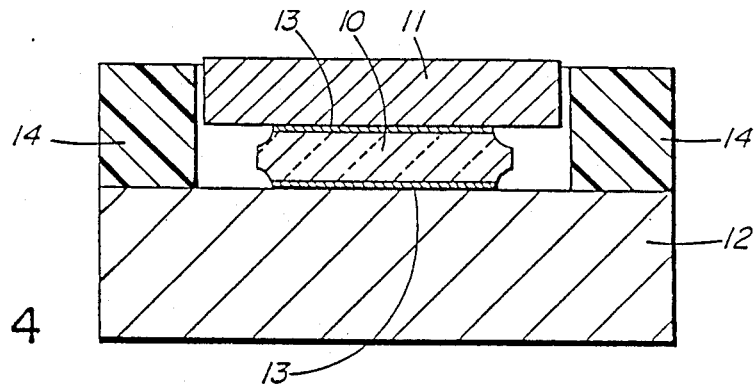
FIG. 4 is a cross-section as on the line IV—IV of FIG. 1, but with an annular ring of synthetic resin in position.
Figure 5:
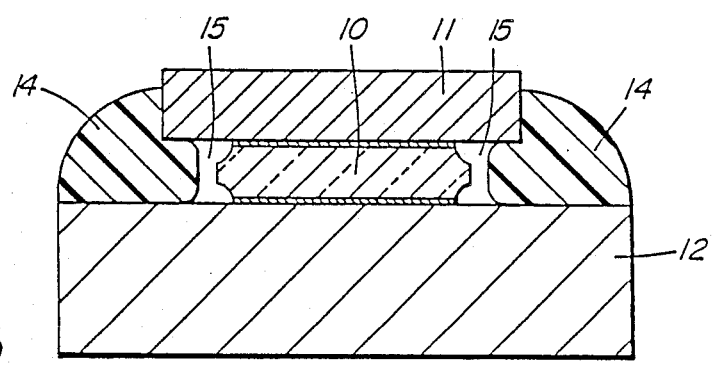
FIG. 5 is a cross-section similar to that of FIG. 4, but after the synthetic resin ring has been heated and has flowed to adhere to the electrodes.

FIGS. 4 and 5 illustrate, to a larger scale, the arrangement of a semiconductor overvoltage protection device within the present invention. Seen in FIGS. 4 and 5 are the solder layers 13 which connect electrodes 11 and 12 to the chip 10. Also evident in FIG. 4 is annular sealing member 14. FIG. 5 illustrates the arrangement after the assembly has been heated, with the sealing member having moved to some degree into the gap between the electrodes and having become adhered to the electrodes. As previously mentioned, the electrodes 11,12 and sealing member 14 define a cavity wherein chip 10 is positioned, and a small gap 15 normally remains between the resin member and the chip 10.

Figure 6:
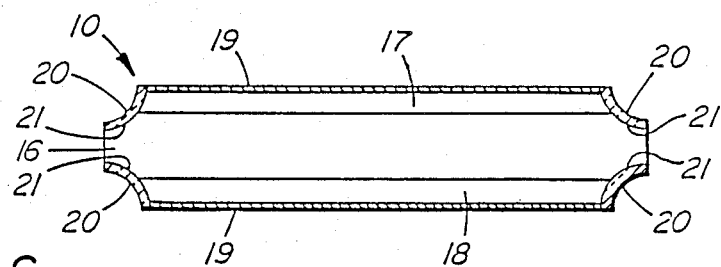
FIG. 6 is a diagrammatic cross-section through one form of solid state device, as used in the arrangement of FIGS. 1 to 5.

FIG. 6 illustrates a typical form of chip 10, comprising a central silicon part 16 of one conductive type, such as N type, with outer layers 17 and 18 of the opposing (P) type. Local areas of N type (not shown) are formed in the P layers 17 and 18. A layer 19 of nickel or other solder-acceptable material is formed on each of the layers 17 and 18, the layers 19 providing electrical connection and a surface that will permit soldering to the electrodes 11 and 12. A fused-glass or similar coating 20 is normally formed at the curved edges 21 of the chip 10.

As described in greater detail below, ring 14 actually melts during application, changing to a viscous liquid when heated, and flows part way into the gap between the electrodes. (It also assumes a rounded outer periphery, seen in cross-section, as illustrated in FIG. 5.) For assembly purposes, the resin comprising the sealing member should completely wet the metal interfaces of the protective device, and form a strong adhesive bond with the metal electrodes, without flowing out of the device.

In addition to being dielectric and remaining flexible over a wide temperature range (typically, between about $-40°$ and $60°$ C.), thermoplastic sealing member 14 thus must adhere strongly to the metal electrodes, and must not char or disintegrate, even upon explosive device failure. No foreign matter should enter between the electrodes, affecting the short which must be maintained upon device failure. To this end, the resin comprising member 14 should liquify at the solder temperature.

By the same token, the resin used should not corrode any metallic element in the protector, a requirement militating against the inclusion of inorganic components (sulfate, alkali-metal, nitrate, etc.) in the sealing-member material. Processing aids, such as tachifiers and plasticizers, and other additives that might volatilize under high-wattage conditions are likewise not preferred.

Suitable thermoplastic resins to use according to the present invention can be selected, in satisfaction of the foregoing criteria, from among known olefin acrylic copolymers, including copolymers containing ethylene acrylic acid, ethylene methacrylic acid monomers, propylene acrylic acid monomers, propylene methacrylic acid monomers, and metal salts and esters thereof. These copolymers readily adhere to the metal electrodes when hot, are generally flexible, dielectric and stable. Other polymers can be used so long as they meet the above-mentioned criteria of activating adhesively below the solder temperature, maintaining flexibility and stability at operating temperatures, and the like. Some acrylic epoxies, urethanes, polyamides and styrenes will work, for example, but suitable olefin acrylic copolymers are both environmentally inert and readily available. By contrast, other resins require special formulation and are not so readily available, and therefore are generally more costly.

The ethylene-acrylic acid copolymers are particularly suitable for use in the present invention. It is a feature of such copolymers that a larger proportion of acrylic acid is associated with higher adhesiveness and pliability, but also greater conductivity and reactivity. The acrylic acid raises the melt index of the resin and lowers the viscosity in the liquid state. One especially useful resin from this group is an ethylene-acrylic acid copolymer comprising from about 6% to about 30% acrylic acid, especially about 20% acrylic acid, in terms of molecular ratio. Representative of such a copolymer are the PIMACOR family of adhesive resins manufactured by the Dow Chemical Company (Midland, Mich. U.S.A.).

Figure 7:
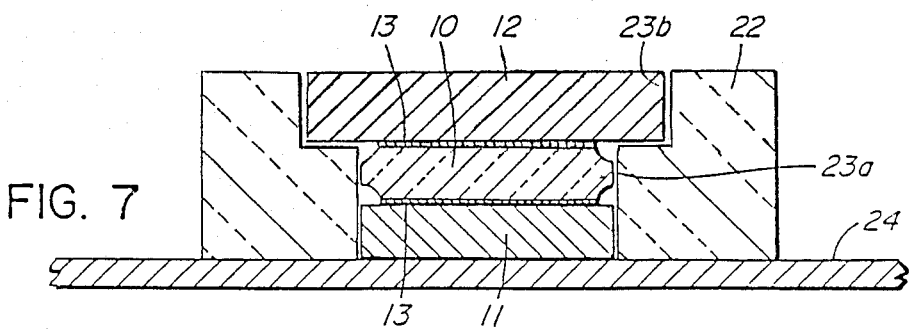
FIG. 7 is a cross-section illustrating one way of assembling electrodes and device.

FIG. 7 illustrates one method for assembling a protector. A smaller electrode 11 is positioned in an annular ceramic member 22 having bores 23a and 23b, bore 23a being of a diameter to accept electrode 11 with a fairly close fit. Being located by the corners, chip 10 is placed on electrode 11. Larger electrode 12 is then positioned in the ceramic member 22, being a fairly close fit in bore 23b. The surfaces of electrodes 11 and 12 which contact chip 10 are coated beforehand with solder; alternatively, the surfaces of chip 10 are coated, or even electrode and device coated.

In FIG. 7, the assembly of electrodes, chip and ceramic member rests on a support member 24. Heating melts the solder and fuses the chip and electrodes together. The support member itself can be the heating member, or the assembly can be moved on a conveyor over a heating member or through a furnace, for example. After the solder sets, the assembly is removed from the ceramic member. Ring 14 is positioned on electrode 12 and, after the whole assembly is turned over, heating causes the resin to flow, adhering to the electrodes and sealing the assembly.

The assembly can also be soldered with the large electrode 12 on the bottom, but by positioning the large electrode on the top, as in FIG. 7, the weight of the large electrode provides a useful loading during soldering.

When protectors of the present invention are to be retrofitted to existing protector modules, certain overall dimensional limitations apply, such as external diameter and, possibly, overall height or thickness. When used as original equipment, such as in modules specifically designed to use the protector of the present invention, then the various parameters relating to designing the protector itself apply.

In this regard, it was indicated above that the thermal response of a protector within the present invention is partially a function of electrode mass and thickness. More specifically, it can be assumed, for design purposes, that there is no heat exchange between the protective device and the environment; accordingly, the greater the total electrode mass (and the larger the heat-sink capacity) of the device, the longer is the service life of the device. In practice, therefore, the upper limit on electrode mass (and, concomitantly, on electrode thickness) is determined by economic considerations, such as the cost of the chosen electrode metal.

At the lower limit, on the other hand, electrode thickness must be such as to accommodate the heat generated by the slowest transients experienced in the particular system incorporating a protective device of the present invention. A convenient standard for slow transients in this regard is the so-called "$10 \times 1000$" pulse, which has a rapid leading edge (exponentially rising to about 90% maximum value within 10 $\mu$sec) and a delayed falling edge (exponentially declining to about 50% maximum value within 1000 $\mu$sec). When the conductive layer between a metal electrode and the chip of the protective device is pure metal or a suitably conductive metal alloy, rather than solder, the minimum useful electrode thickness approaches the lower limit on thickness determined for the theoretical ideal, i.e., for a device wherein electrode and chip contact directly. With a copper electrode and the $10 \times 1000$ pulse as standard, this ideal lower limit, which can be approached when nonsolder conductive layers are employed, corresponds to an electrode thickness (i.e., along the axis of the device) of about 20 mil.

When a solder layer is used, for example, in order to accommodate the difference in expansion coefficients between chip material and the selected electrode metal, the effective heat-sinking capacity of the electrode is reduced by the substantially lower heat-conductivity of the solder layer. In particular, less of the heat generated by even a slow transient is conducted through the solder layer to the electrode over the duration of the transient, thereby reducing the heat-absorbing effect of a thicker electrode, i.e., the minimum useful electrode thickness is reduced.

For purposes of optimizing the mechanical stability of a device within the present invention, it has been found that a solder layer having a thickness between 0.3 and 3 mil, and especially between 0.3 and 1 mil, is employed to advantage. With a copper electrode and a $10 \times 1000$ standard transient, the minimum useful electrode thickness is about 16 mil when a 0.3-mil solder layer is employed, and about 9 mil with a solder layer of about 1 mil in thickness. In a device as illustrated in FIGS. 1-5, where one electrode is larger than the other, preferred thicknesses for the upper (smaller) and lower electrodes is 40 and 60 mil, respectively.

These illustrative values for layer thicknesses would be adjusted, in accordance with the foregoing description, to accommodate design choices as to electrode metal and conductive-layer material, as well as to the nature of slow transients experienced in the electronic system of interest. Alternatively, electrodes of a standard thickness, say, of about 10 mil, in a "prepackaged" module which can be provided with an additional heat-adsorbing element to adapt the module, as necessary, to the repetitive surge conditions anticipated in a given system.

Figure 8:
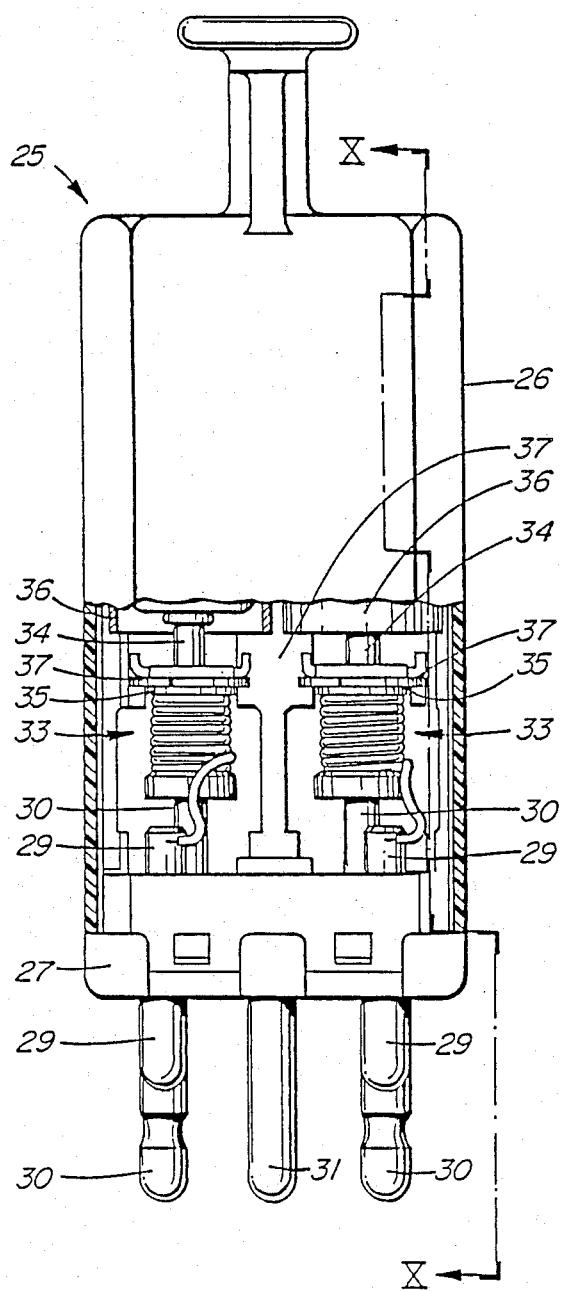
FIG. 8 is a front view, partly in section, of one form of conventional protector module incorporating the present invention.
Figure 9:
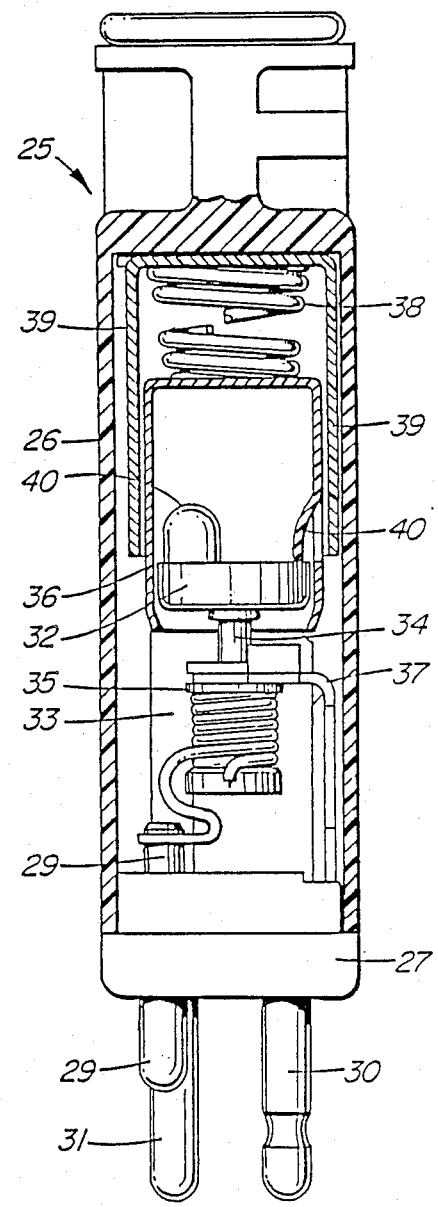
FIG. 9 is a cross-section on the line X—X of FIG. 8.

A device of the present invention, as described and illustrated above, can be manufactured to replace other protectors, and to be retrofitted to existing protector modules. FIGS. 8 and 9 illustrate the application, in one form of protector module, of protectors within the present invention. The module 25 is exemplary of protector modules having two protectors for protecting both conductors of a telephone line. It comprises a housing 26, open at its lower end, and a base 27 which is attached to the lower end. Two pairs of line terminals 29 and 30 are provided in the base, plus a ground terminal 31. In the example, there is both a primary overvoltage protector 32, which is of the form as illustrated in FIG. 5, and a heat coil unit 33, which is in series in the telephone line between terminals 29 and 30. Heat coil unit 33 has a central pin 34 soldered to spool 35 of the heat coil. On the occurrence of an overcurrent condition, or a sustained overvoltage, the solder joint melts and pin 34 moves down, permitting a cup 36 to move down and contact a ground contact 37 connected to ground terminal 31. This is conventional.

Normally positioned within cup 36 is a carbon block or a gas tube protector. Under an overvoltage condition, breakdown across a gap in the protector occurs, thus providing a path from pin 34 through the protector to cup 37, through spring 38 to ground member 39, which is also connected to ground contact 37. In the example illustrated, cup 36 has been modified by the forming of a number of indents 40, for example, three. These indents are positioned such that protector 32 is held with electrode 11 (FIGS. 1 to 5) in contact with the top end of pin 34. The contact surface of electrode 11 is at the same level, as would be the contact surface of the electrode of a conventional protector. Electrode 12 (FIGS. 1 to 5) of protector 32 is in contact with the indents 40 and, hence, in contact with cup 36. Primary protection for overvoltage surges is thus through pin 34, protector 32, cup 36, spring 38, ground member 39 and ground contact 37. Overcurrent protection is as previously described, by melting of a solder joint permitting movement of cup 36 down to ground contact 37.

Instead of indenting cup 36, at 40, a normal cup can be used, together with a spacer or a spring, to hold protector 32 at the correct position.

Module 25 can be redesigned so as to take advantage of the reduced height of the protector 32 as compared to a conventional carbon block or gas tube protector. Cup 36 can be much shorter, sufficient to house the protector. Such a reduction in height can be particularly useful where two protectors are mounted in line in a module, rather than side-by-side as in the example.

Figures 10, 11:
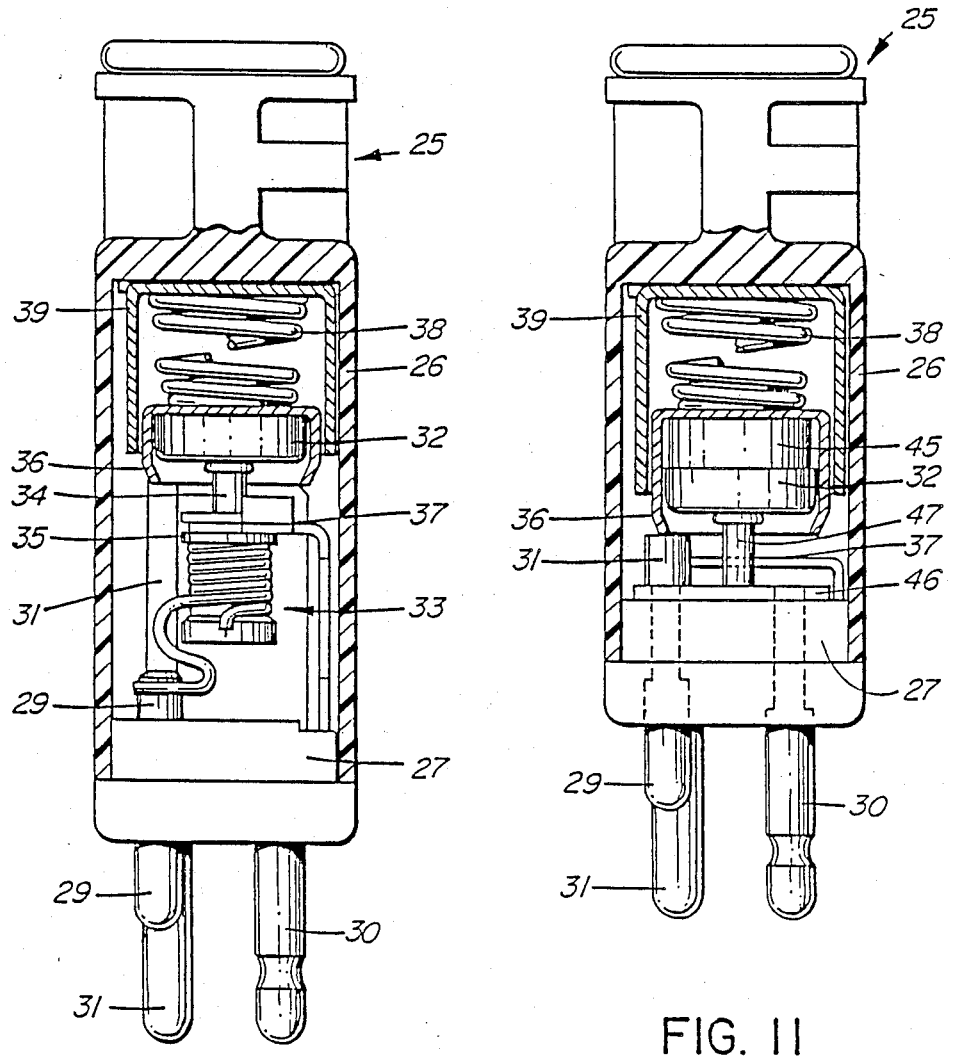
FIG. 10 is a cross-section, similar to that of FIG. 9 but illustrating a protector module more specifically designed to incorporate the present invention.
FIG. 11 is a cross-section, similar to that of FIG. 10, but of a protector module without a heat coil subassembly.

FIGS. 10 and 11 illustrate two exemplary forms of module specifically arranged to accommodate protector devices in accordance with the present invention. (Where practical, the same reference numerals are used for items common with FIGS. 9 and 10.) FIG. 11 shows a module which includes a heat coil, while the module depicted in FIG. 12 lacks a heat coil but incorporates a fusible pellet.

As illustrated in FIG. 10, module 25 has a housing 26, open at its lower end, and a base 27 attached to the lower end. Line terminals 29 and 30, and a ground terminal 31, are provided in the base. In this example, there are both a primary overvoltage protector 32 and a heat coil unit 33. The heat coil unit is in series in the telephone line between terminals 29 and 30. The heat coil unit has central pin 34 soldered to spool 35, and on occurrence of an overcurrent condition, or of a sustained overvoltage, the solder joint melts and the pin moves down, permitting cup 36 to move down and contact ground contact 37, which is connected to the ground terminal.

The difference between the arrangement of FIG. 10 and that of FIG. 9 is that cup 36 in FIG. 10 is considerably shorter than in FIG. 9. The cup need only be long enough to house protector 32. This enables housing 26 also to be shorter.

FIG. 11 illustrates a module 25 which does not have a heat coil unit. It comprises housing 26, open at its lower end, and base 27 attached to the lower end of the housing. The base has line terminals 29 and 30 and ground terminal 31. The overvoltage protector 32, as in FIG. 5, is positioned in cup 36. A pellet 45 is positioned behind protector 32 in cup 36, the pellet being of a fusible alloy. A shunt 46 connects the line terminals 29 and 30, and a pin 47 extends up from the shunt and is in contact with electrode 11 (FIGS. 1 to 5) of the protector 32 The other electrode 12 (FIGS. 1-5) is in contact with the cup 36. Upon the instance of an overvoltage condition, breakdown across protector 32 occurs, to pellet 45, cup 36 and spring 38, and then to ground contact 37. In the event of a sustained overvoltage condition, the pellet 45 melts and the cup 36 moves down and contacts the ground contact 37.

The actuation of the examples in both FIG. 10 and FIG. 11 is conventional, the difference being the use of solid state protector 32, instead of a more usual carbon block or gas tube protector. This enables a considerable reduction in height of the complete module.

Figure 12:
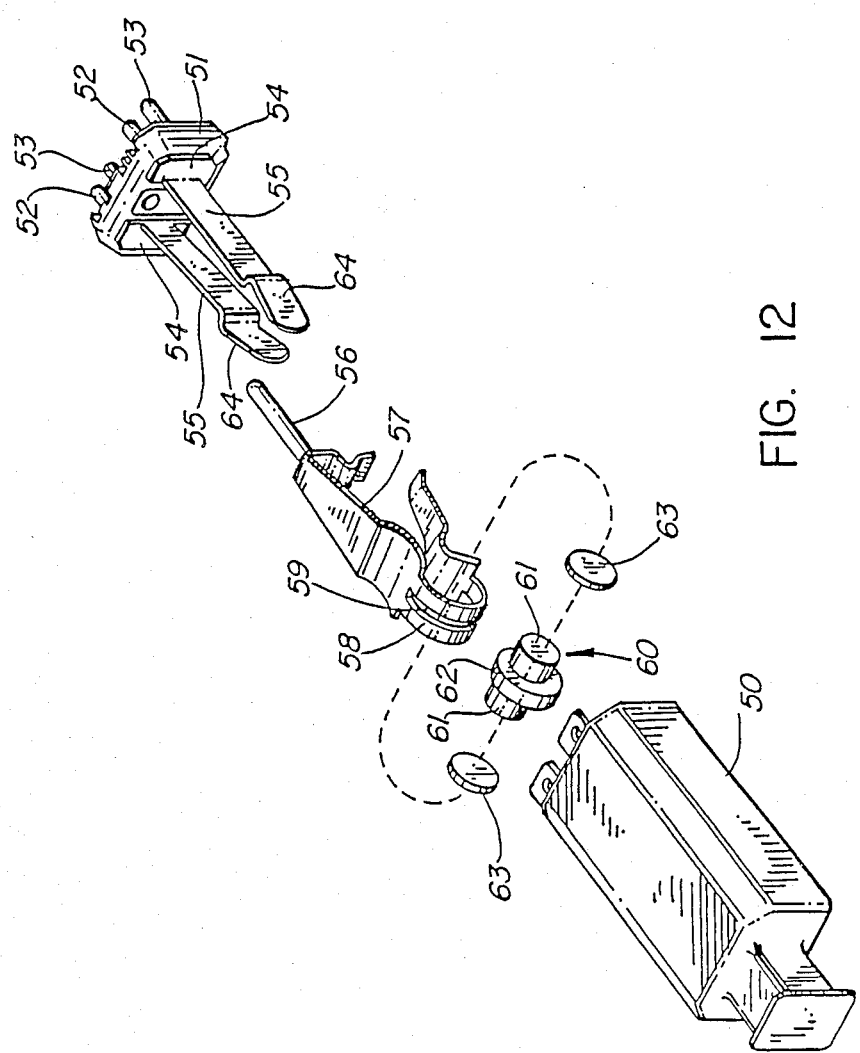
FIG. 12 is an exploded perspective view of another form of protector module, incorporating the present invention.

FIG. 12 illustrates the application of the invention to a further form of protector module, often referred to as a three-electrode module. The module comprises a housing 50 and a base 51 attaching to an open end of the housing. In the base are line terminals 52 and 53, with a shunt 54 connecting each pair of line terminals. Extending from each shunt is a spring cantilever contact member 55. Also mounted in the base is a ground terminal 56, carrying a contact member 57. At the end remote from the terminal 56, contact member 57 is formed into a cylindrical shape 58, which is slotted at 59. Positioned in the cylindrical shape 58 is a protector 60. Protector 60 comprises two solid state devices 61, as in FIGS. 1 to 5, back to back, with a central electrode 62 which fits into slot 59. In this arrangement, electrodes 12 (FIGS. 1 to 5) are effectively connected together. Two fusible pellets 63 are positioned one on each side of protector 60, making contact with electrodes 11 (FIGS. 1-5). When assembled, with ground terminal 56 in base 51, the protector 60 and pellets 63 are also held between the free ends 64 of the cantilever contact members 55. Normal overvoltage surges are shunted to ground by breakdown of one or both of the solid-state devices 61 to ground, to electrode 62, contact member 57 and terminal 56. On a sustained overvoltage condition, fusion of one or both pellets 63 will enable one or both contact members 55 to contact ground member 57.

What is claimed is:

1. An electronic system comprising at least one circuit that includes surge-protecting means for protecting said circuit against a current surge up to $10^4$ amps or more, said surge-protecting means comprising a first electrode and a second electrode; a heat and electrical-conductive layer applied to a surface of said first and second electrodes, respectively; a semiconductor chip that contacts a conductive layer applied to said first and second electrodes, respectively; and a resilient, annular sealing member extending around the periphery of and adhered to both electrodes, said sealing member (a) defining with said electrodes a cavity wherein said chip is provided and (b) comprising a thermoplastic resin that is a flexible, dielectric material, wherein said electrodes are capable of moving together into direct contact to sustain a short-circuit in the event of total chip destruction.

2. An electronic system as claimed in claim 1, wherein said thermoplastic resin comprises an olefin acrylic copolymer.

3. An electronic system as claimed in claim 2, wherein said copolymer comprises a monomer from the group consisting of an ethylene acrylic acid, an ethylene methacrylic acid, a propylene acrylic acid and a propylene methacrylic acid copolymer, or a metal salt or ester thereof.

4. An electronic system as claimed in claim 3, wherein said copolymer is an ethylene acrylic acid copolymer containing from about 6% to 30% acrylic acid.

5. An electronic system as claimed in claim 4, wherein said ethylene acrylic acid copolymer contains about 20% acrylic acid.

6. An electronic system as claimed in claim 1, wherein said first and second electrodes are comprised of copper, each of said electrode having a thickness of at least about 20 mil.

7. An electronic system as claimed in claim 6, wherein said conductive layer is comprised of a metal foil.

8. An electronic system as claimed in claim 1, wherein said conductive layer is a solder layer which joins an electrode to a surface of said chip.

9. An electronic system as claimed in claim 8, wherein said solder layer has a thickness of between about 0.3 and 3 mil.

10. An electronic system as claimed in claim 9, wherein said first electrode has a total area that is larger than that of said second electrode.

11. An electronic system as claimed in claim 10, wherein said second electrode is disc-shaped and has a diameter approximately equal to the maximum transverse dimension of said chip.

12. An electronic system as claimed in claim 11, wherein said annular sealing member is adhered to a surface on said first electrode that faces towards said second electrode.

13. An electronic system as claimed in claim 12, wherein each of said first and second electrodes is a copper disc having a thickness of at least 9 mil.

14. A semiconductor surge protection device comprising a first electrode and a second electrode; a heat- and electrical-conductive layer applied to a surface of said first and second electrodes, respectively; a semiconductor chip that contacts a conductive layer applied to said first and second electrodes, respectively; and a resilient, annular sealing member extending around the periphery of and adhered to both electrodes, said sealing member (a) defining with said electrodes a cavity wherein said chip is provided and (b) comprising a thermoplastic resin that is a flexible, dielectric material, wherein said electrodes are capable of moving together into direct contact to sustain a short circuit in the event of total chip destruction.

15. A device as claimed in claim 14, wherein said thermoplastic resin comprises an olefin acrylic copolymer.

16. A device as claimed in claim 15, wherein said copolymer comprises a monomer from the group consisting of an ethylene-acrylic acid, an ethylene methacrylic acid, a propylene acrylic acid and a propylene methacrylic acid copolymer, or a metal salt or ester thereof.

17. A device as claimed in claim 16, wherein said copolymer is an ethylene-acrylic acid copolymer containing from about 6% to 30% acrylic acid.

18. A device as claimed in claim 17, wherein said ethylene-acrylic acid copolymer contains about 20% acrylic acid.

19. A device as claimed in claim 14, wherein said first and second electrodes are comprised of copper, each of said electrode having a thickness of at least about 20 mil.

20. A device as claimed in claim 19, wherein said conductive layer is comprised of a metal foil.

21. A device as claimed in claim 14, wherein said conductive layer is a solder layer which joins an electrode to a surface of said chip.

22. A device as claimed in claim 21, wherein said solder layer has a thickness of between about 0.3 and 3 mil.

23. A device as claimed in claim 22, wherein said first electrode has a total area that is larger than that of said second electrode.

24. A device as claimed in claim 23, wherein said second electrode is disc-shaped and has a diameter approximately equal to the maximum transverse dimension of said chip.

25. A device as claimed in claim 24, wherein said annular sealing member is adhered to a surface on said first electrode that faces towards said second electrode.

26. A device as claimed in claim 25, wherein each of said first and second electrodes is a copper disc having a thickness of at least 9 mil.

* * * * *